(12) United States Patent
Gao et al.

(10) Patent No.: US 7,682,761 B2
(45) Date of Patent: **\*Mar. 23, 2010**

(54) METHOD OF FABRICATING A GRAYSCALE MASK USING A WAFER BONDING PROCESS

(75) Inventors: Wei Gao, Vancouver, WA (US); Bruce D. Ulrich, Beaverton, OR (US); Yoshi Ono, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 459 days.

This patent is subject to a terminal disclaimer.

(21) Appl. No.: 11/709,008

(22) Filed: Feb. 20, 2007

(65) Prior Publication Data

US 2008/0197107 A1    Aug. 21, 2008

(51) Int. Cl.
    *G03F 1/00* (2006.01)
(52) U.S. Cl. .......................................... 430/5; 438/717
(58) Field of Classification Search ............... 430/5, 430/321; 438/455, 700, 717, 34, 48
    See application file for complete search history.

(56) References Cited

U.S. PATENT DOCUMENTS

| 5,324,623 | A | 6/1994 | Tsumori | |
| 5,374,564 | A | 12/1994 | Bruel | |
| 6,071,652 | A * | 6/2000 | Feldman et al. | 430/5 |
| 6,127,070 | A * | 10/2000 | Yang et al. | 430/5 |
| 6,163,407 | A | 12/2000 | Okazaki et al. | |
| 2005/0170655 | A1 * | 8/2005 | Bencher et al. | 438/700 |
| 2006/0183027 | A1 * | 8/2006 | Lin et al. | 430/5 |
| 2008/0176148 | A1 * | 7/2008 | Ono et al. | 430/5 |

\* cited by examiner

*Primary Examiner*—Mark F Huff
*Assistant Examiner*—Stewart A Fraser
(74) *Attorney, Agent, or Firm*—Law Office of Gerald Maliszewski; Gerald Maliszewski

(57) ABSTRACT

A method of fabricating a grayscale mask includes preparing a quartz wafer; depositing a layer of $Si_3N_4$ on the quartz wafer; depositing a layer of titanium/TEOS directly on the $Si_3N_4$ layer on the backside of the quartz wafer; removing the layer of $Si_3N_4$ from the front side of the quartz wafer; depositing a layer of SRO directly on the front side of the quartz wafer; patterning a microlens array on the SRO layer; etching the SRO layer to form a microlens array in the SRO layer; depositing a layer of titanium; patterning and etching the titanium layer; depositing a layer of $SiO_xN_y$ on the SRO microlens array; CMP to planarize the layer of $SiO_xN_y$; removing the titanium/TEOS layer from the backside of the quartz wafer; bonding the planarized $SiO_xN_y$ to a quartz reticle plate; and etching to remove $Si_3N_4$ from the bonded structure to form a grayscale mask reticle.

20 Claims, 3 Drawing Sheets

METHOD OF FABRICATING A GRAYSCALE MASK USING A WAFER BONDING PROCESS

FIELD OF THE INVENTION

This invention relates to microlens fabrication and specifically to a technique of microlens fabrication using a wafer bonding process.

BACKGROUND OF THE INVENTION

Microlens arrays are optical elements used in CCD or CMOS imagers. Placement of a microlens above an active photodetector allows more light to be collected, increasing the electrical signal strength, thus improving the sensitivity of the image sensor. Methods for making microlens in a cost effective way have been reported in U.S. Pat. No. 5,324,623, granted Jun. 28, 1994 to Tsumori et al. for Microlens forming method, and U.S. Pat. No. 6,163,407, granted Dec. 19, 2000, to Okazaki et al., for Microlens array and method of forming same and solid-state image pickup device and method of manufacturing same. The approach of both these patents is to form the lens shape in photoresist, followed by a dry etch pattern transfer to the lens material. The methods to form lens shapes in photoresist include photoresist reflow and direct patterning, using a grayscale mask. The photoresist reflow method has a fill-factor limitation because merging of neighboring lenses must be avoided.

One method for generating a grayscale mask is by e-beam lithography into a high-energy-beam-sensitive (HEBS) material, as is done by Canyon Material. Inc., however, this process is very slow and expensive when fabricating a large image sensor array.

A technology to fabricate grayscale masks in a cost effective way using silicon rich oxide (SRO) as a light attenuating material has been developed, and disclosed in U.S. patent application Ser. No. 11/588,891, filed Oct. 27, 2006, by Ono et al., for Grayscale Reticle for Precise Control of photoresist Exposure. By forming the SRO layer into the desired lens shapes, and putting the film on a reticle plate for use in a photolithography tool, the exposed pattern printed in the photoresist will have the desired lens shapes and orientations. The photolithographic method of fabricating prototype SRO based grayscale mask is disclosed in the above-cited pending patent application, which describes deposition of SRO on a quartz substrate and subsequent patterning and etching into the desired lens shape, and in U.S. patent application Ser. No. 11/657,258, for Method of Fabricating a Grayscale Mask using SmartCut® Wafer Bonding Process, filed Jan. 24, 2007, and U.S. patent application Ser. No. 11/657,326, for Method of Making a Grayscale Reticle Using Step-Over Lithography for Shaping Microlenses, filed Jan. 24, 2007.

In order for the grayscale mask to be used in a conventional IC fabrication process, it has to be made on a reticle plate having the requisite alignment features so that it can be mounted and used in a photolithographic step and repeat tool (stepper). In the preferred embodiment, a six-inch reticle, made out of a 0.25 inch-thick low thermal expansion, quartz plate, having a rectangular shape, is used in a stepper, whereas conventional IC processing tools use only round wafers. Fabrication of a SRO-based grayscale mask on a square quartz plate in a conventional IC processing facility is not possible without major tool modifications. It is necessary to have a transfer technology that allows the completed SRO-grayscale mask formed on a round wafer to be placed on a square quartz plate.

Wafer bonding technology has been used in the IC industry as one method of fabricating a silicon-on-insulator (SOI) device structure, which in turn facilitates high-performance CMOS technologies. A bonding technique using the Smart Cut® is described in one of the above-cited patent applications, and the Smart Cut® process is described in U.S. Pat. No. 5,374,564, granted Dec. 20, 1994 to Bruel, for Process for the production of thin semiconductor material films. In the Smart Cut® method, $H^+$ or $H_2$ implantation and cleaving, or splitting, is required. It is known, however, that hydrogen implantation places a temperature limitation on subsequent processing steps, which, if the temperature is not minimized, will cause hydrogen aggregation, i.e., blisters. In order to avoid blister generation, the process temperature must be limited, and, as the result of such temperature limitation, the finished IC devices lack the degree of quality which would have been achieved with fabrication at higher temperature.

Furthermore, the splitting or cleaving step at the end of the Smart Cut® technology requires an anneal at about 500° C. This step has the tendency to magnify the existing defects either by increasing size of the defective area, or by increasing defect density. To reduce the defect level generated using the Smart Cut® process, a stringent process control is required, which adds to the cost of ICs fabricated using the Smart Cut® process. In some instances, however, use of the Smart Cut® technique for bonding may be desirable, as described in the above-identified method.

SUMMARY OF THE INVENTION

A method of fabricating a grayscale mask includes preparing a quartz wafer; depositing a layer of $Si_3N_4$ on the quartz wafer; depositing a layer of titanium/TEOS directly on the $Si_3N_4$ layer on the backside of the quartz wafer; removing the layer of $Si_3N_4$ from the front side of the quartz wafer; depositing a layer of SRO directly on the front side of the quartz wafer; patterning a microlens array on the SRO layer; etching the SRO layer to form a microlens array in the SRO layer; depositing a layer of titanium; patterning and etching the titanium layer; depositing a layer of $SiO_xN_y$ on the SRO microlens array; CMP to planarize the layer of $SiO_xN_y$; removing the titanium/TEOS layer from the backside of the quartz wafer; bonding the planarized $SiO_xN_y$ to a quartz reticle plate; and etching to remove $Si_3N_4$ from the bonded structure to form a grayscale mask reticle.

It is an object of the invention to form a grayscale mask using a quartz wafer for initial mask fabrication.

It is another object of the invention to provide a grayscale mask using a wafer bonding process to transfer the mask fabricated on the quartz wafer to a quartz reticle plate.

This summary and objectives of the invention are provided to enable quick comprehension of the nature of the invention. A more thorough understanding of the invention may be obtained by reference to the following detailed description of the preferred embodiment of the invention in connection with the drawings.

DETAILED DESCRIPTION OF THE PREFERRED EMBODIMENTS

The method of the invention provides an alternative to conventional wafer bonding for grayscale mask fabrication. A quartz wafer is used in place of the conventional silicon wafer. Lens features are formed on the quartz wafer. The quartz wafer is diced into proper size and directly bonded to a quartz reticle plate. Hydrogen implantation is not required in the method of the invention, and the process temperature is limited only by the softening temperature of the quartz wafer. As there is no cleaving step, efficient fabrication of a grayscale reticle is achieved.

The method of the invention facilitates formation of a reticle plate through a wafer bonding process, where all depositions, patterning steps, etches, chemical mechanical polishing, etc., are performed on a quartz wafer prior to bond transfer. When all the desired features are completed on the wafer, and a final polishing step provides a flat silicon oxide surface, the wafer is ready for bonding. In this invention, the planarized quartz wafer is diced to a proper size, forming pieces from the quartz wafer, or plate. The size of each piece is large enough so that all of the active areas, including the necessary alignment marks, are located on a single piece, while, the individual pieces are small enough and thin enough so that the reticle handling process is not complicated by the size and thickness of the quartz pieces. The pieces of the diced quartz wafer may be bonded with the reticle plate by direct bonding technology, i.e., flat surface+modified surface condition, or by using glues e.g., optical cement a.k.a. "lens glue".

The bonding process simplifies the grayscale mask fabrication process by eliminating a cleaving step and silicon removing steps, as used in Smart Cut® technology. However, the film deposition condition is more or less changed because the substrate is quartz rather than silicon.

Figure 1:
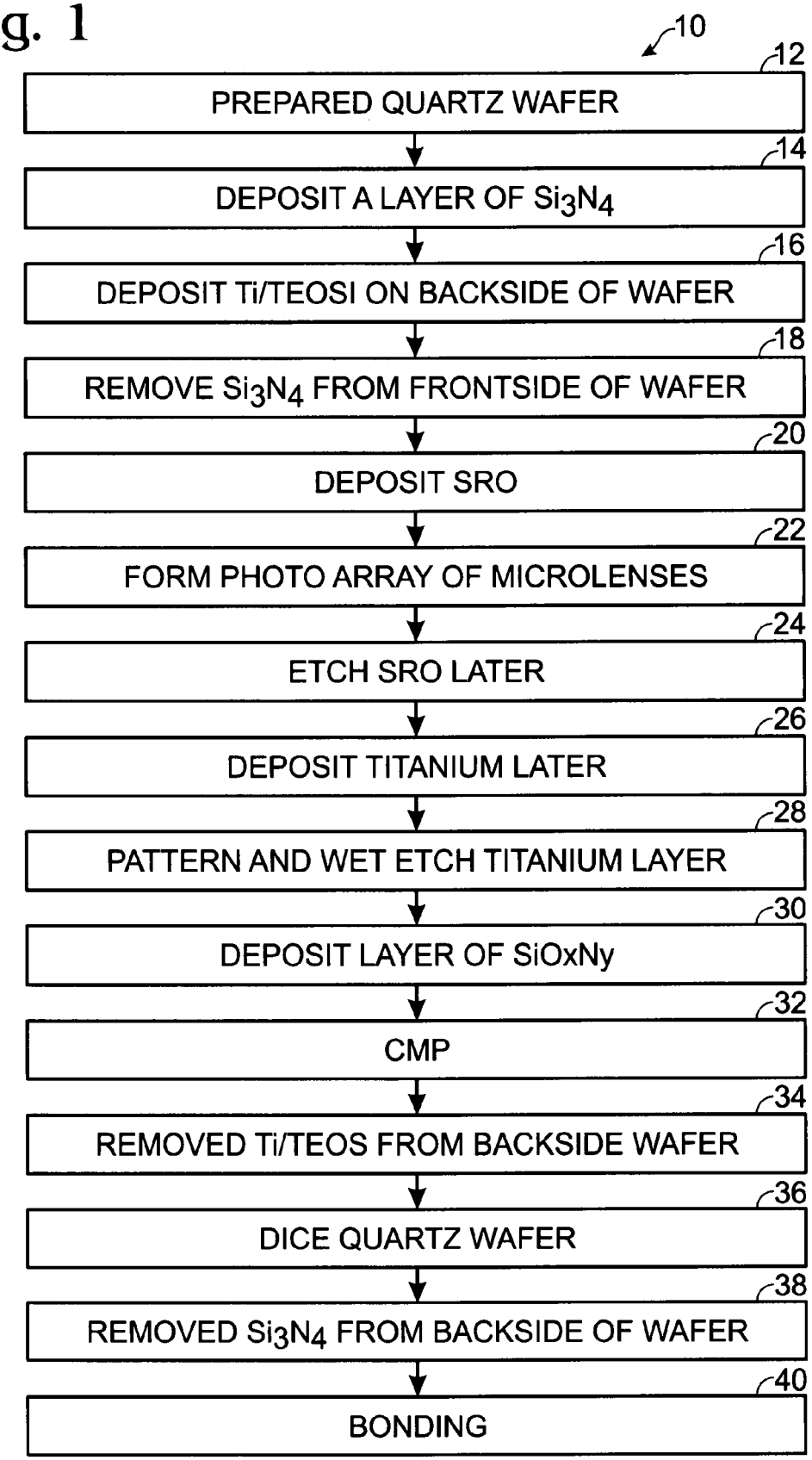
FIG. 1 is a block diagram of the method of the invention.

Turning now to FIG. 1, the method of the invention is depicted generally at 10. Initially, a quartz wafer is prepared, 12, which includes preparation of a 150 mm diameter quartz wafer.

A layer of $Si_3N_4$ is deposited on both sides of the quartz wafer 14, by LPCVD, which provides good etching selectivity with the quartz when the $Si_3N_4$ is eventually removed, and ensures high optical quality of the reticle plate. The $Si_3N_4$ layer also provides front side protection when a Ti/TEOS stack is deposited 16 on the backside of the wafer, which includes depositing a layer of titanium and then depositing a layer of TEOS, on top of the backside $Si_3N_4$, to form a three-layer-stack as scratch protection. The total thickness of this three-layer structure has to be more than 1 μm. The titanium layer provides opacity to the quartz wafer so that the process tools used in IC processes will not have flat-finding errors. The TEOS layer provides protection to the titanium layer during the remainder of the fabrication process. The $Si_3N_4$ layer provides an etch stop layer during subsequent TEOS/Ti layer removal.

After the wafer backside is protected by the combined $Si_3N_4$/Ti/TEOS layer, the front side $Si_3N_4$ is removed, 18, in hot phosphoric acid, which also provides good etch selectivity with the quartz wafer, which in turn, provides a good optical surface for the final reticle plate. Because of stress considerations, this $Si_3N_4$ layer is normally no more than 100 nm thick. The quartz wafer is now as opaque as a normal silicon wafer and is ready for SRO deposition and lens fabrication processes.

A layer of SRO is deposited, 20, and a microlens array formed therein 22 by conventional means, well known to those of ordinary skill in the art, which includes etching 24 the SRO layer.

A titanium layer is deposited to a thickness of between about 100 nm to 300 nm, by evaporation, 26 on the SRO layer, patterned and etched, 28. This titanium layer is used to form all the features on the reticle plate, such as alignment marks, fiducials, reticle label(s), etc., so that the finished reticle will work with state-of-the-art steppers. It also masks all the unused, non-active, areas on the plate. Other metals, such as Al, Cr, V, Ni, Ag, Ta, etc., may be used in place of titanium, so long as chemical etch step 28 has sufficient selectivity between the selected metal and the underlying SRO.

A layer of transparent material, such as $SiO_xN_y$ is deposited 30, which is engineered to match the refractive index of the SRO layer, so that the reflection and diffraction on the interface is minimized after this layer is planarized by CMP 32 so that the surface of the $SiO_xN_y$ layer will provide a good bonding surface. However, it may be necessary to deposit another layer of TEOS on top of the $SiO_xN_y$ layer, and preform a second CMP step, which likely will provide a better quality bond. This second TEOS layer may be omitted if optical cement is used in the bonding process. The refractive index of $SiO_xN_y$ is matched to the refractive index of the SRO, so that the reflection at the $SiO_xN_y$/SRO interface is minimized. It is critical to have this match because any mismatch on the refractive index will cause light bending at the interface, as well as reflection from the interface. The $SiO_xN_y$ may be replaced by other transparent materials, such as $TiO_x$, $ZrO_x$, and $HfO_x$ (where x varies from 1 to 2) provided that the selected material has the requisite refractive index match with the SRO lens material. The deposition method may be sputtering, CVD, and PECVD.

The TEOS and titanium layers are removed from the backside of the quartz wafer, 34. This is accomplished by treatment with 50:1 buffered oxide etch (BOE) for etching the TEOS layer and $H_2O_2$, with 5% $NH_3OH$ for etching the titanium layer. The $Si_3N_4$ layer provides an adequate etch stop for this process.

The quartz wafer is nearly ready for a dicing step, 36, however, before dicing, photoresist is normally applied to the front side of the wafer to protect same. The dicing process does not initially cut through the quartz wafer, and leaves a layer of quartz about 0.2 mm thick, so that the wafer is still in one piece. Leaving the wafer intact facilitates subsequent removal of the photoresist and $Si_3N_4$ before bonding, thus, the wafer may be processed in a conventional manner, as a whole wafer, and is pieced only before bonding of the wafer to a quartz reticle.

The final bonding step 40 may be performed using one of two techniques: The first technique is direct bonding, which includes a pre-bonding cleaning and surface modification. Pre-bonding cleaning is performed by dipping the wafer sample in 50:1 BOE for about two to five minutes. The surface modification treatment is performed in diluted SC1 solution at room temperature. After bonding, the bonded structure is annealed at about 200° C. for about two hours, to cure the reticle and to increase the bond strength.

The other bonding technique is to glue the diced piece to a quartz reticle plate using optical cement, a.k.a. "lens glue." In this case, although an additional layer is included in the structure, the optical cement is transparent and normally has an adjustable refractive index ranging from 1.46 to 1.61, which may be tuned to match that of the quartz reticle plate. The optical cement may be UV or thermal cured so as to render the bond defect free.

Figure 2:
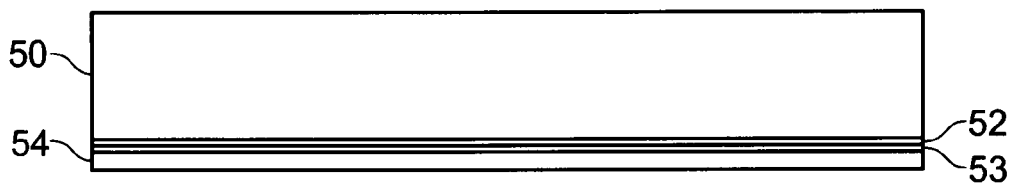
FIGS. 2 through 7 depict steps in fabricating a microlens array according to the method of the invention.
Figure 3:
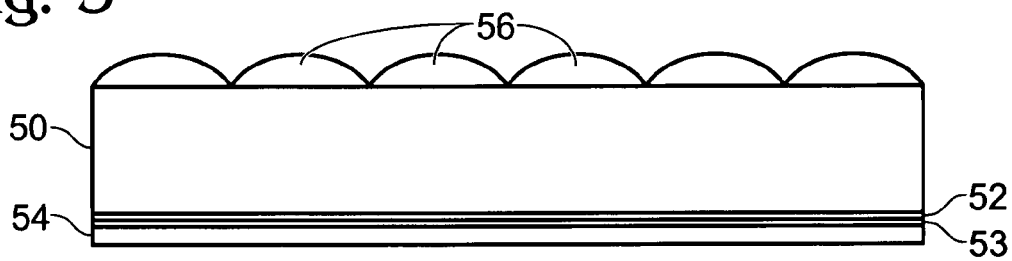

FIGS. 2 to 7 depict the method of the invention as applied to a quartz wafer 50. FIG. 2 depicts wafer 50 having backside protection layers of $Si_3N_4$ 52, a titanium layer 53, and a TEOS layer 54. A layer of SRO is deposited on the wafer and configured into an microlens array 56, which is formed after patterning and etching of the SRO layer, as shown in FIG. 3.

Figure 4:
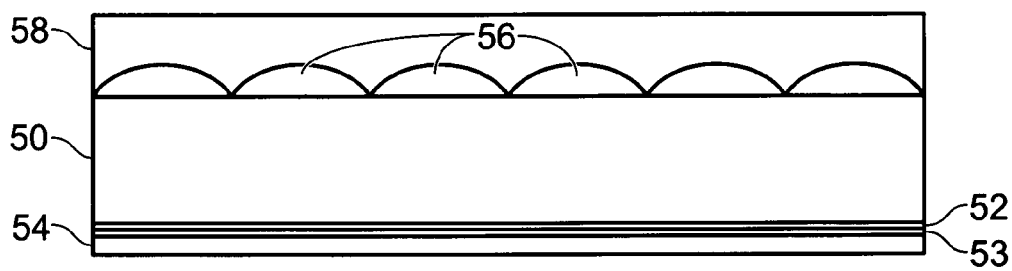
Figure 5:
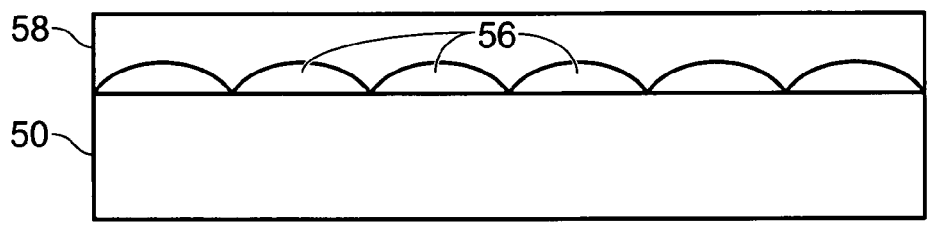

A layer of $SiO_xN_y$ is deposited and planarized by CMP, as depicted in FIG. 4. FIG. 5 depicts a wafer portion following dicing, and removal of the backside protection layers 52, 53 and 54.

Figure 6:
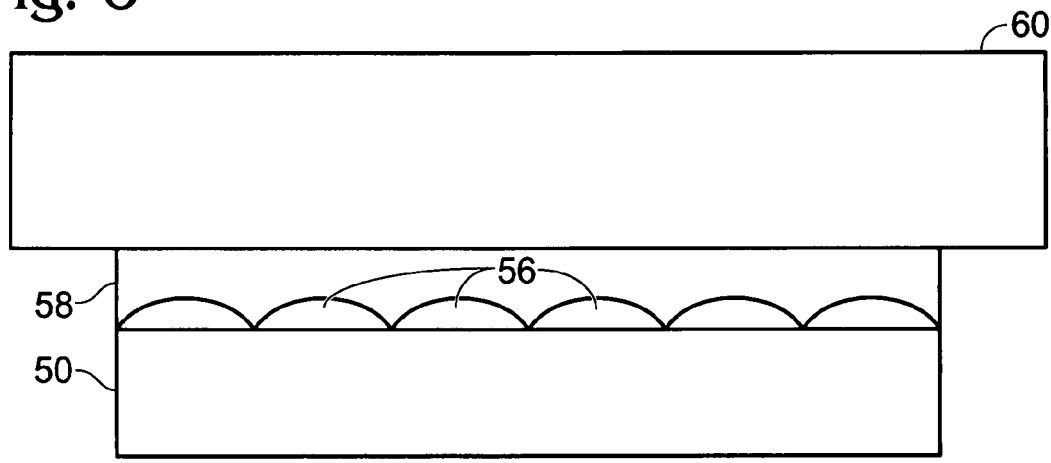

FIG. 6 depicts a quartz reticle after bonding using the direct bonding method of the invention, wherein a piece of the quartz wafer with the microlens array formed thereon is bonded to a quartz reticle plate 60.

Figure 7:
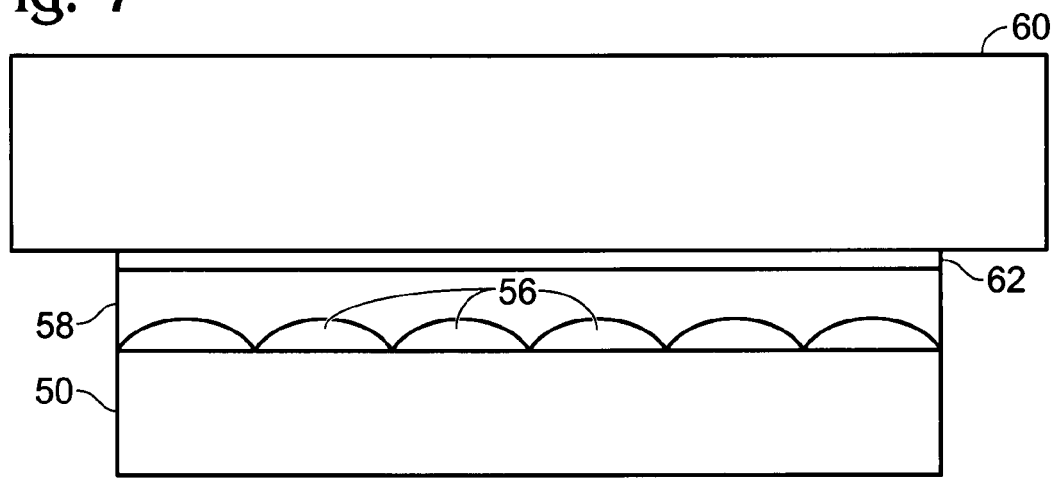

FIG. 7 depicts quartz reticle after bonding using the glue bonding method of the invention, wherein a piece of the quartz wafer with the microlens array formed thereon is glued by a layer of optical cement 62 to a quartz reticle plate 60.

Thus, a method of fabricating a grayscale mask using a wafer bonding process has been disclosed. It will be appreciated that further variations and modifications thereof may be made within the scope of the invention as defined in the appended claims.

We claim:

1. A method of fabricating a grayscale mask, comprising:
   preparing a quartz wafer having a front side and a backside;
   depositing a layer of $Si_3N_4$ directly on both sides of the quartz wafer;
   depositing a layer of titanium directly on the $Si_3N_4$ layer on the backside of the quartz wafer, and depositing a layer of TEOS on directly on the titanium layer, forming a Ti/TEOS layer;
   removing the layer of $Si_3N_4$ from the front side of the quartz wafer;
   depositing a layer of SRO directly on the front side of the quartz wafer;
   patterning a microlens array on the SRO layer;
   etching the SRO layer to form a microlens array in the SRO layer;
   depositing a layer of titanium on the SRO;
   patterning and etching the titanium layer;
   depositing a layer of $SiO_xN_y$ on the SRO microlens array;
   CMP to planarize the layer of $SiO_xN_y$;
   removing the titanium/TEOS layer from the backside of the quartz wafer;
   bonding the planarized $SiO_xN_y$ to a quartz reticle plate to form a bonded structure; and
   etching to remove $Si_3N_4$ from the bonded structure to form a grayscale mask reticle.

2. The method of claim 1 wherein a refractive index of the $SiO_xN_y$ layer is matched to a refractive index of the SRO, so that the reflection at the $SiO_xN_y$/SRO interface is minimized.

3. The method of claim 1 which includes, after said CMP, depositing a layer of TEOS to facilitate bonding between $SiO_xN_y$ and the quartz reticle plate.

4. The method of claim 1 wherein said bonding includes direct bonding of the $SiO_xN_y$ layer to the quartz reticle plate.

5. The method of claim 1 wherein said bonding includes bonding of the $SiO_xN_y$ layer to the quartz reticle plate using an optical cement layer.

6. The method of claim 5 wherein the optical cement is transparent and has an adjustable refractive index ranging from 1.46 to 1.61, which is tuned to match the refractive index of the quartz reticle plate.

7. The method of claim 1 wherein said etching to remove $Si_3N_4$ from the bonded structure includes wet etching in hot $H_3PO_4$ to remove $Si_3N_4$ on the optical path of the reticle to minimize reflection and interference produced as a result of the high refractive index of $Si_3N_4$.

8. A method of fabricating a grayscale mask, comprising:
   preparing a quartz wafer having a front side and a backside;
   depositing a layer of $Si_3N_4$ directly on both sides of the quartz wafer;
   depositing a layer of titanium/TEOS directly on the $Si_3N_4$ layer on the backside of the quartz wafer;
   removing the layer of $Si_3N_4$ from the front side of the quartz wafer;
   depositing a layer of SRO directly on the front side of the quartz wafer;
   patterning a microlens array on the SRO layer;
   etching the SRO layer to form a microlens array in the SRO layer;
   depositing a layer of titanium;
   patterning and etching the titanium layer;
   depositing a layer of a transparent silicon oxide on the SRO microlens array, wherein a refractive index of the transparent silicon oxide layer is matched to a refractive index of the SRO, so that the reflection at a transparent silicon oxide/SRO interface is minimized;
   CMP to planarize the layer of transparent silicon oxide;
   removing the titanium/TEOS layer from the backside of the quartz wafer;
   bonding the planarized transparent silicon oxide layer to a quartz reticle plate; and
   etching to remove $Si_3N_4$ from the bonded structure to form a grayscale mask reticle.

9. The method of claim 8 wherein refractive indices of the transparent silicon oxide layer and the SRO layer are matched so that reflection and refraction are minimized at the SRO/transparent silicon oxide interface.

10. The method of claim 8 which includes, after said CMP, depositing a layer of TEOS to facilitate bonding between the transparent silicon oxide and the quartz plate.

11. The method of claim 8 wherein said etching to remove $Si_3N_4$ from the bonded structure includes wet etching in hot $H_3PO_4$ to remove $Si_3N_4$ on the optical path of the reticle to minimize reflection and interference produces as a result of the high refractive index of $Si_3N_4$.

12. The method of claim 8 wherein the transparent silicon oxide is $SiO_xN_y$.

13. The method of claim 8 wherein said bonding includes direct bonding of the $SiO_xN_y$ layer to the quartz reticle plate.

14. The method of claim 8 wherein said bonding includes bonding of the $SiO_xN_y$ layer to the quartz reticle plate using an optical cement layer.

15. The method of claim 14 wherein the optical cement is transparent and has an adjustable refractive index ranging from 1.46 to 1.61, which is tuned to match the refractive index of the quartz reticle plate.

16. A method of fabricating a grayscale mask, comprising:
   preparing a quartz wafer having a front side and a backside;
   depositing a layer of $Si_3N_4$ directly on both sides of the quartz wafer;
   depositing a layer of titanium/TEOS directly on the $Si_3N_4$ layer on the backside of the quartz wafer;
   removing the layer of $Si_3N_4$ from the front side of the quartz wafer;
   depositing a layer of SRO directly on the front side of the quartz wafer;
   patterning a microlens array on the SRO layer;
   etching the SRO layer to form a microlens array in the SRO layer;
   depositing a layer of titanium;
   patterning and etching the titanium layer;
   depositing a layer of a $SiO_xN_y$ on the SRO microlens array, wherein a refractive index of the $SiO_xN_y$ layer is matched to a refractive index of the SRO, so that the reflection at a $SiO_xN_y$/SRO interface is minimized;
   CMP to planarize the layer of $SiO_xN_y$ removing the titanium/TEOS layer from the backside of the quartz wafer;

bonding the planarized $SiO_xN_y$ layer to a quartz reticle plate; and etching to remove $Si_3N_4$ from the bonded structure to form a grayscale mask reticle.

17. The method of claim 16 wherein refractive indices of the $SiO_xN_y$ layer and the SRO layer are matched so that reflection and refraction are minimized at the SRO/$SiO_xN_y$ interface.

18. The method of claim 16 which includes, after said CMP, depositing a layer of TEOS to facilitate bonding between the $SiO_xN_y$ layer and the quartz reticle plate.

19. The method of claim 16 wherein said etching to remove $Si_3N_4$ from the bonded structure includes wet etching in hot $H_3PO_4$ to remove $Si_3N_4$ on the optical path of the reticle to minimize reflection and interference produces as a result of the high refractive index of $Si_3N_4$.

20. The method of claim 16 wherein said bonding includes bonding processes taken from the group of bonding processing consisting of direct bonding of the $SiO_xN_y$ layer to the quartz reticle plate and bonding of the $SiO_xN_y$ layer to the quartz reticle plate using an optical cement layer, wherein the optical cement is transparent and has an adjustable refractive index ranging from 1.46 to 1.61, which is tuned to match the refractive index of the quartz reticle plate.

* * * * *